United States Patent [19]

Maier

[11] Patent Number: 5,541,513
[45] Date of Patent: Jul. 30, 1996

[54] MRI CENTER POINT ARTIFACT ELIMINATION USING REALTIME RECEIVER PHASE CONTROL

[75] Inventor: Joseph K. Maier, Milwaukee, Wis.

[73] Assignee: General Electric Company, Milwaukee, Wis.

[21] Appl. No.: 422,383

[22] Filed: Apr. 14, 1995

[51] Int. Cl.$^6$ .................................................. G01R 33/48
[52] U.S. Cl. .................................................. 324/309
[58] Field of Search ...................... 324/300, 309, 324/307, 306, 318

[56] References Cited

U.S. PATENT DOCUMENTS

| 4,443,760 | 4/1984 | Edelstein et al. | 324/309 |
|---|---|---|---|
| 4,612,504 | 9/1986 | Pelc | 324/309 |
| 4,616,182 | 10/1986 | Kramer et al. | 324/309 |
| 4,888,552 | 12/1989 | Egozi et al. | 324/309 |
| 4,959,611 | 9/1990 | Brovost et al. | 324/309 |
| 5,245,283 | 9/1993 | Provost et al. | 324/309 |
| 5,329,925 | 9/1994 | NessAiver | 324/306 |

Primary Examiner—Sandra L. O'Shea
Assistant Examiner—Raymond Y. Mah
Attorney, Agent, or Firm—Quarles & Brady

[57] ABSTRACT

A method and apparatus for eliminating baseline error artifacts in NMR images produced using ultrafast pulse sequences including alternating the phase of a reference signal during the reception of NMR echo signals to invert alternate views in the acquisition. The inverted views are re-inverted prior to image reconstruction such that any dc levels introduced during acquisition are converted to a high spacial frequency which moves the resulting artifacts to the borders of the image reconstructed using a Fourier transformation.

6 Claims, 3 Drawing Sheets

MRI CENTER POINT ARTIFACT ELIMINATION USING REALTIME RECEIVER PHASE CONTROL

BACKGROUND OF THE INVENTION

The field of the invention is nuclear magnetic resonance imaging methods and systems. More particularly, the invention relates to the removal of baseline error artifacts in images produced by ultrafast imaging methods.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this NMR signal may be received and processed to form an image.

When utilizing these signals to produce images, magnetic field gradients ($G_x$ $G_y$ and $G_z$) are employed. Typically, the region to be imaged is scanned by a sequence of separate measurement cycles (referred to as "views") in which these gradients vary according to the particular localization method being used. The resulting set of received NMR signals are digitized and processed to reconstruct the image using one of many well known reconstruction techniques.

A well known problem with MRI systems is the introduction of baseline errors into the received NMR echo signals. This error occurs when a dc level is added to the NMR echo signal during its reception, demodulation and digitization. This dc level may be introduced by dc offsets in the analog receiver circuitry, or by stray signals that are demodulated to a dc level along with the NMR echo signal. Continued improvements to the receiver hardware have reduced, but not eliminated this problem.

One way to eliminate baseline errors is to acquire two NMR echo signals at each phase encoding view. The phase of the RF excitation pulse is inverted 180° for one of the two pulse sequences, and the two received NMR echo signals are subtracted. The subtraction nulls the dc level introduced by the receiver and doubles the level of the NMR signal for that view. Unfortunately, this solution also doubles the scan time because two measurements are required of each phase encoding view.

A similar solution which also addresses the increased scan time was disclosed in U.S. Pat. No. 4,612,504, issued Sep. 16, 1986 entitled "Method For Removing The Effects Of Baseline Error Components In NMR Imaging Applications". This method alternates the phase of the RF excitation pulse for successive phase encoding views. Prior to image reconstruction, the NMR signals for alternate phase encoding views are re-inverted so that the NMR signals in all views have the same polarity. This re-inversion also inverts any dc level in alternate views. As a result, the dc level alternates in polarity for successive views in k-space and is now a high frequency signal component in the phase encoding direction. The subsequent column Fourier transformation used during image reconstruction translates this high frequency component and places an artifact at the edges of the reconstructed image rather than its center. This is the prevailing method for solving the baseline error problem, and it is very effective.

The concept of acquiring NMR image data in a short time period has been known since 1977 when the echo-planar pulse sequence was proposed by Peter Mansfield (J. Phys. C.10: L55–L58, 1977). In contrast to standard pulse sequences, the echo-planar pulse sequence produces a large number of NMR echo signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and there has been a long felt need for apparatus and methods which will enable EPI to be practiced in a clinical setting. Other echo-planar pulse sequences are disclosed in U.S. Pat. Nos. 4,678,996; 4,733,188; 4,716,369; 4,355,282; 4,588,948 and 4,752,735.

A variant of the echo planar imaging method is the Rapid Acquisition Relaxation Enhanced (RARE) sequence which is described by J. Hennig et al in an article in *Magnetic Resonance in Medicine* 3,823–833 (1986) entitled "RARE Imaging: A Fast Imaging Method for Clinical MR." The essential difference between the RARE sequence and the EPI sequence lies in the manner in which echo signals are produced. The RARE sequence utilizes RF refocused echoes generated from a Carr-Purcell-Meiboom-Gill sequence, while EPI methods employ gradient recalled echoes.

Yet another variant is described by D. A. Feinberg and K. Oshio "GRASE (Gradient and Spin Echo) MR Imaging: A New Fast Clinical Imaging Technique", in *Radiology*, 181:597–604, 1991.

All of these "ultrafast" imaging methods involve the acquisition of multiple echo signals from a single excitation pulse in which each acquired echo signal is separately phase encoded. Each pulse sequence, or "shot," therefore results in the acquisition of a plurality of views. In a single shot acquisition, the method previously used to eliminate image artifacts due to baseline errors cannot be used with these ultrafast pulse sequences, because there is no one-for-one correspondence between RF excitation pulse and NMR echo signal.

SUMMARY OF THE INVENTION

The present invention is a method for eliminating baseline error artifacts in NMR images produced using ultrafast pulse sequences. More specifically, when performing an ultrafast pulse sequence in which a plurality of NMR echo signals are produced following the application of a single RF excitation pulse, the present invention is practiced by alternating the polarity of the successive phase encoded NMR echo signals during their reception. Prior to image reconstruction, the inverted NMR echo signals are reinverted with the result that any dc level introduced during reception is inverted in alternate phase encoding views and becomes a high frequency component. During image reconstruction, any artifacts therefrom are then displayed at the phase encoding borders of the reconstructed image.

A general object of the invention is to eliminate artifacts due to baseline errors without increasing the scan time. By alternating the polarity of the received NMR echo signals in a pattern that results in the inversion of alternate views in k-space, a proper image is reconstructed by first re-inverting alternate views in k-space. The re-inversion also inverts any dc level produced during reception and the resulting high frequency of this component is transferred to the phase encoding border of the reconstructed image during the subsequent Fourier transformation along the phase encoding direction.

A more specific objective is to reduce artifacts due to baseline errors without costly hardware changes or burdensome changes to the MRI system software. Inversion of the received NMR echo signals is easily accomplished by inverting the reference signal used during demodulation of the received echo signals. Such an inversion is controlled by the same MRI system components and software used to execute the fast spin echo pulse sequence.

DESCRIPTION OF THE PREFERRED EMBODIMENT

Figure 1:
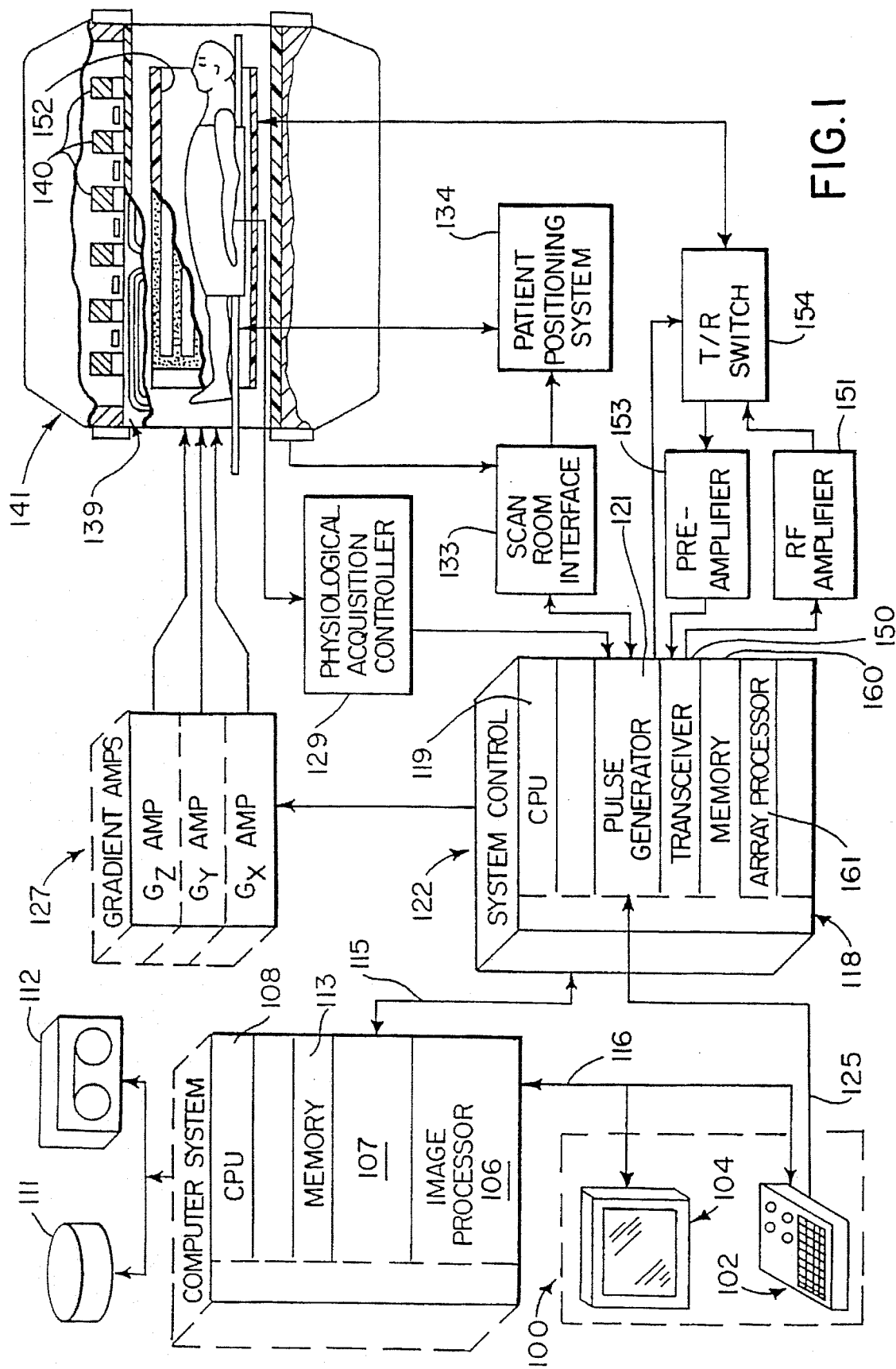
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
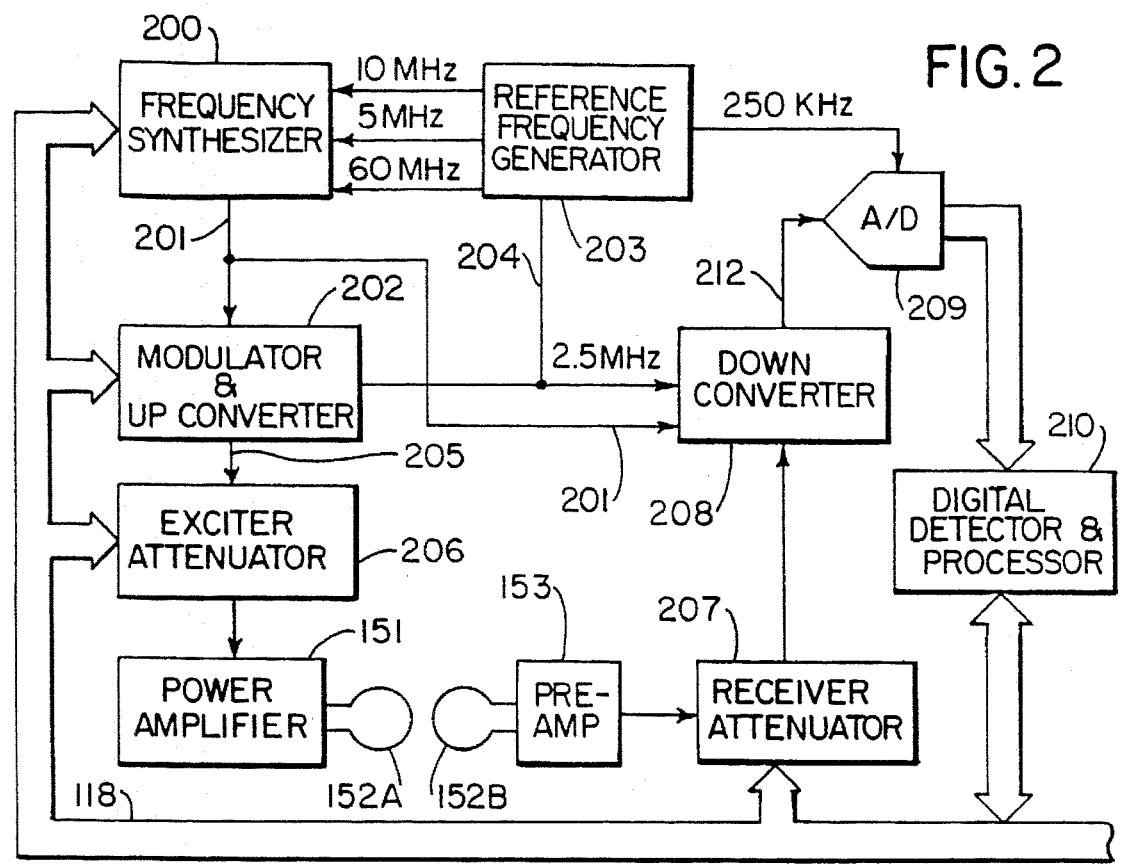
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting NMR signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. As described above, the phase of the carrier signal on line 201 is controlled by the frequency synthesizer 200 in response to a phase command received from the pulse generator module 121. To practice the present invention, this phase command is changed during the fast spin echo pulse sequence to invert (i.e. 180° phase change) the carrier signal on line 201 during the reception of alternate ones of the NMR echo signals in the shot. Inversion of the carrier signal on line 201 effectively inverts the NMR echo signal at the output of down converter 208.

The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
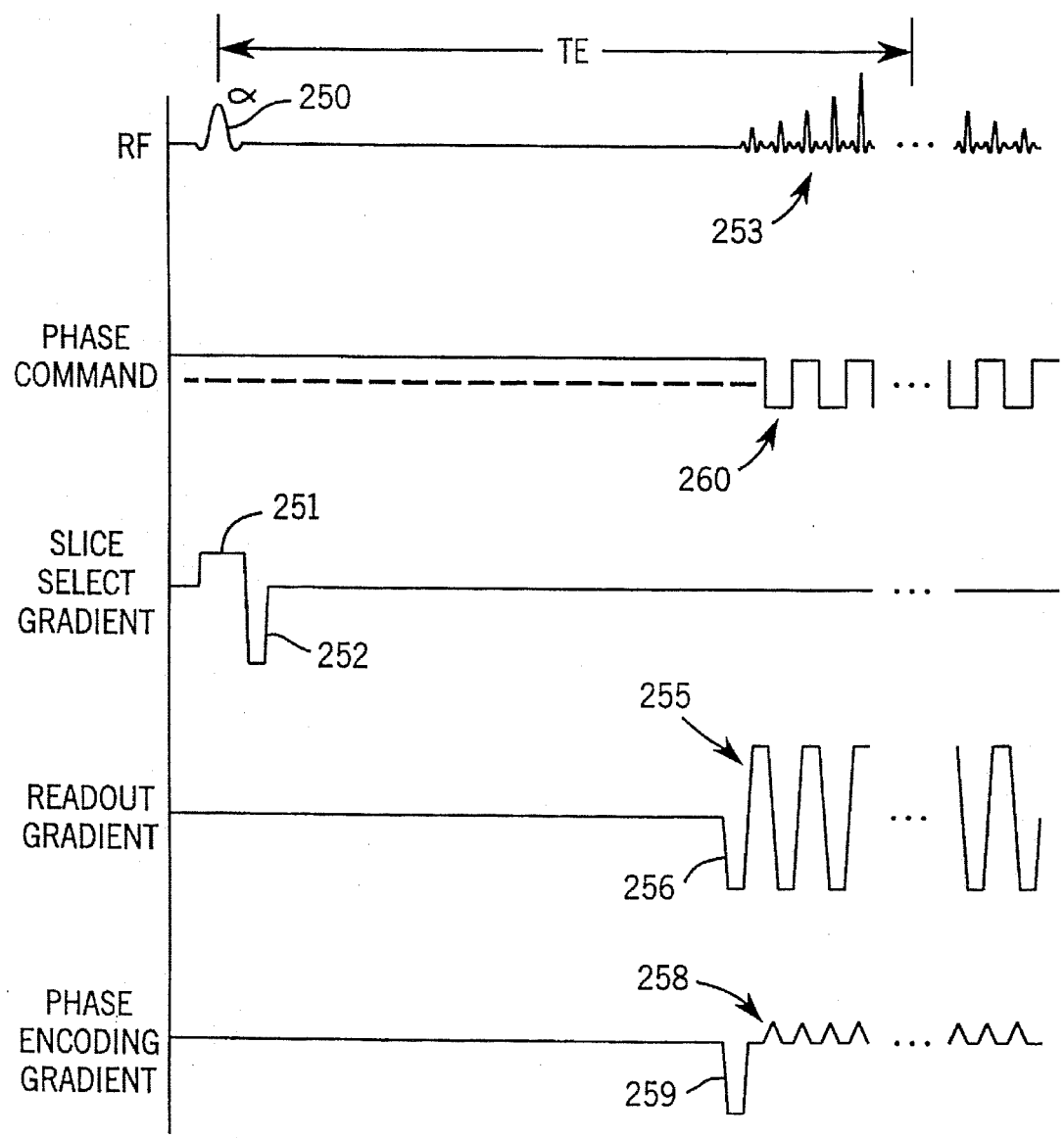
FIG. 3 is a graphic representation of an EPI pulse sequence which is employed in the preferred embodiment of the invention.

The echo-planar (EPI) pulse sequence employed in the preferred embodiment of the invention is illustrated in FIG. 3. An RF excitation pulse 250 is applied in the presence of a $G_z$ slice select gradient pulse 251 to produce transverse magnetization in a slice. The excited spins are rephased by a negative lobe 252 on the slice select gradient $G_z$ and then a time interval elapses before the readout sequence begins. A total of 128 separate NMR echo signals, indicated generally at 253, are acquired during the EPI pulse sequence. Each NMR echo signal 253 is a different view which is separately phase encoded to scan $k_y$-space in 128 monotonically acquired views centered about $k_y=0$. The readout sequence is positioned such that the view acquired at $k_y=0$ occurs at the desired echo time (TE).

The NMR echo signals 253 are gradient recalled echoes produced by the application of an oscillating $G_x$ readout gradient field 255. The readout sequence is started with a negative readout gradient lobe 256 and the echo signals 253 are produced as the readout gradient oscillates between positive and negative values. A total of 128 samples are taken of each NMR echo signal 253 during each readout gradient pulse 255. The successive 128 NMR echo signals 253 are separately phase encoded by a series of 128 $G_y$ phase encoding gradient pulses 258. The first pulse is a negative lobe 259 that occurs before the echo signals are acquired to encode the first view at $k_y=-64$. Subsequent phase encoding pulses 258 occur as the readout gradient pulses 255 switch polarity, and they step the phase encoding monotonically upward through $k_y$ space.

As the phase encoding is stepped through $k_y$ space and the 128 NMR echo signals 253 are acquired, the phase command is alternated as indicated at 260. These alternations represent a 180° phase shift in the carrier signal on line 201 (FIG. 2) and they cause the polarity of alternate ones of the NMR echo signals 253 to be inverted. At the completion of the EPI pulse sequence, therefore, 128 separate frequency encoded samples of 128 separately phase encoded (and alternating polarity) NMR echo signals 253 have been acquired. The resulting 128×128 element array of complex numbers is an NMR data set which is used to reconstruct an image.

Prior to reconstructing the image, however, the polarity of alternate rows of samples in this NMR data set are re-inverted. Each row of samples represents one phase encoded NMR echo signal, and by re-inverting alternate rows, the polarity of all the acquired NMR echo signals are again the same. As explained above, however, this re-inversion of alternate rows also inverts any dc level which was introduced into the NMR signals as they were acquired. Consequently, the dc level is now a signal component that alternates in polarity in the phase encoding direction of k-space (i.e. along the $k_y$ axis of the NMR data set).

Image reconstruction is accomplished by performing a two-dimensional Fourier transformation on the altered NMR data set. As a natural consequence of the Fourier transformation performed in the column direction (i.e. along the $k_y$ axis), the high frequency alternating dc component is transposed to a location in image space on the image borders (i.e. y=±64). Consequently, any resulting artifact caused by baseline errors is far removed from the center of the reconstructed image where it will not interfere with the diagnostic quality of the image.

While the invention is described with respect to a single shot EPI pulse sequence, it should be apparent to those skilled in the art that it is equally applicable to odd-interleaved multishot EPI and to other ultrafast pulse sequences. For example, the RARE pulse sequence produces a plurality of NMR echo signals following the creation of transverse magnetization by a single RF excitation pulse. The polarity of these can be alternated in the same manner as described above by changing the phase command prior to each NMR echo signal acquisition.

Also, the particular pattern used to alternate polarity of the acquired NMR echo signals will depend on the order in which the phase encoding traverses k-space. In the EPI pulse sequence of the preferred embodiment, k-space is traversed monotonically and the NMR echo signals are alternated in polarity as they are received. However, if k-space is traversed in another order the pattern of NMR echo signals inversion may be different. The important factor is that the NMR echo signals that are stored in the NMR data set alternate in polarity along the phase encoding direction at the maximum rate possible.

It should also be apparent that other means can be used to alternate the polarity of the NMR echo signals as they are received. The important factor is that this inversion occur before the introduction of the dc level that produces the baseline error to be corrected.

I claim:

1. A method for eliminating baseline error artifacts in NMR images produced during a scan using an ultrafast pulse sequence, the steps comprising:

performing an ultrafast pulse sequence in which a series of separately phase encoded NMR echo signals are produced in response to transverse magnetization produced by a single RF excitation pulse;

acquiring the series of separately phase encoded NMR echo signals and inverting the polarity of alternate phase encoded ones of the separately phase encoded NMR echo signals as they are acquired;

storing an NMR data set comprised of successive phase encoded ones of the separately phase encoded NMR echo signals acquired during the scan;

inverting the polarity of alternate phase encoded ones of the separately phase encoded NMR echo signals stored in the NMR data set; and reconstructing an image by performing a Fourier transformation on the NMR data set.

2. The method as recited in claim 1 in which the scan is completed by performing a single ultrafast pulse sequence.

3. The method as recited in claim 1 in which the ultrafast pulse sequence is an echo-planar pulse sequence.

4. The method as recited in claim 3 in which the separately phase encoded NMR echo signals scan a set of phase encoding values in monotonic order.

5. The method as recited in claim 1 in which the series of separately phase encoded NMR echo signals are acquired with a receiver that mixes each NMR echo signal with a reference frequency signal, and the polarity of alternate phase encoded ones of the separately phase encoded NMR echo signals is inverted by inverting the polarity of the reference frequency signal.

6. The method as recited in claim 5 in which the polarity of the reference frequency signal is inverted by shifting its phase 180°.

* * * * *